ically used to provide a correction

United States Patent [19]
Kempter et al.

[11] Patent Number: 4,871,896
[45] Date of Patent: Oct. 3, 1989

[54] PROCESS AND DEVICE TO ENHANCE SYSTEM PERFORMANCE ACCURACY IN A LASER WRITING PROCESS

[75] Inventors: Meinrad Kempter, Lyss; Paul Glauser, Effretikon, both of Switzerland

[73] Assignee: Lasarray Holding AG, Thundorf, Switzerland

[21] Appl. No.: 66,369

[22] Filed: Jun. 25, 1987

[30] Foreign Application Priority Data

Jun. 25, 1986 [CH] Switzerland .................. 02565/86

[51] Int. Cl.$^4$ ............................................ B23K 26/00
[52] U.S. Cl. ......................... 219/121.6; 219/121.83; 219/121.85
[58] Field of Search .................. 219/121.76, 121.77, 219/121.6, 121.85, 121.83; 346/76 L, 108

[56] References Cited

U.S. PATENT DOCUMENTS 4,695,698 9/1987 Mayory et al. .................. 219/121.6

FOREIGN PATENT DOCUMENTS 0168351 1/1986 European Pat. Off. .
0088045 10/1986 European Pat. Off. .

Primary Examiner—C. L. Albritton
Attorney, Agent, or Firm—Neuman, Williams, Anderson & Olson

[57] ABSTRACT

An apparatus and method are disclosed for improving the recognition of reference data in a laser writing process, by storing the locations of chip topography situated along the scan raster in a memory. Using an entry code (reference mark) to provide synchronization of the laser beam and the chip topography, the digital signal coming from the detector of the scanning laser beam is checked for accuracy against the stored pattern. A synchronous correlator circuit is used to provide a corrected output based on the stored information and the actual detected signal which is then used to control the operation of the laser pattern generator. Incorrect tracking of the laser pattern generator due to defects in the scanned surface can thus be reduced or eliminated. Due to this improved recognition of surface reference points, smaller geometries can be used.

4 Claims, 3 Drawing Sheets

PROCESS AND DEVICE TO ENHANCE SYSTEM PERFORMANCE ACCURACY IN A LASER WRITING PROCESS

FIELD OF THE INVENTION

This invention relates to a method (process) and apparatus (device) to enhance accuracy in the recognition of reference marks or indicia in a laser writing process by means of a laser pattern generator in which a scanning laser beam, reacting to surface conditions of a workpiece, is sensed by at least one scanning laser beam detector.

DESCRIPTION OF THE PRIOR ART

Document EP-A1-0 168 351 (corresponding to copending U.S. application Ser. No. 751,258 filed July 2, 1985) is known and discloses a laser pattern generator and the process for its operation. This document is incorporated herein by reference. A writing laser beam and a scanning read laser beam are used whereby the latter scans the surface of a chip (workpiece and is reflected onto at least one detector. A laser scanned workpiece is comprised of a layer of non-metallic material on which a metallized raster is deposited. Proper alignment of the writing laser beam with respect to the workpiece is essential. Until now, analog signals received by the detector have been interpreted directly. The disadvantages inherent in that method are due to the fact that the metallized layer of the workpiece has defects which result in undesired interruptions in the scanning laser beam signals output by the detector. Because these defects have sizes on the order of 0.1 to 1.0 µm, similar in size to the reference marks, rapid classification of the defects and the reference marks must be performed during the scan process. Defect voids or interruptions should be clearly identified, at the latest, approximately 1 or 2 µm after their detection in order to minimize the possibility that certain defects of the scanned surface result in undesirable decisions, which in turn cause erroneous exposures, e.g. on the metallized surface.

SUMMARY OF THE INVENTION

It is an object of this invention to remove the above mentioned disadvantages and to provide a new and improved method and apparatus which prevent interpretation errors on the part of a scanning laser beam reflecting surface anomalies of the scanned workpiece.

In accordance with this and other objects of the invention, a reference mark in the form of a synchronization pattern is disposed at the edge of the workpiece such as a semiconductor chip to provide an entry code. A laser beam influenced by surface conditions of the chip is received by a scanning laser beam detector, which outputs an analog signal to be converted into a digital signal. In turn, the digital signal is fed into a control logic and a synchronizer. The control logic, by means of a control signal, inputs the digital signal into a track pattern memory, which then controls the readout of a stored track pattern. The track pattern is fed into the synchronizer, which compares the digital detector signal and the stored track pattern and outputs a relevant signal for the control of the mutual movement of the writing laser beam and the chip. Thus, the scanned pattern located on the chip, e.g. a metal raster, is stored in a memory as a pattern and is available for synchronous read-out by means of an entry code corresponding to the reference mark. The signal received by the detector is checked for accuracy against the stored track pattern. The results of this comparison are used for track positioning. Thus, an advantage lies in the elimination of incorrect commands to the laser pattern generator due to possible surface anomalities. In place of the metal raster mentioned in the example, non-metallic rasters or projected images can also be used.

In a further aspect of this invention, the digital detector signal is gated into a shift register by track impulses. An output signal is supplied from each position of the shift register and weighted according to its information value. The sum of all weighted output signals of the shift register is compared to a maximum permissible error signal indicative of a predetermined threshold. A digital synchronization signal is produced in a comparator whenever the error threshold is reached. This method permits the successful utilization of error-prone structures. The output signals of the shift register are chosen in such a way to provide a nul output at the expected interval as determined by the track pattern stored in memory.

In a still further aspect of this invention, the detector of the scanning laser beam is connected to an analog to digital (A/D) converter, whose output is coupled to the synchronizer and control logic. The control logic produces the input to the track pattern memory, whose output provides stored data to the synchronizer. The synchronizer provides correction signals for the control logic and an output to control of the laser pattern generator. This circuitry is described in a simplified manner in order to present the solution more clearly.

BRIEF DESCRIPTION OF THE DRAWINGS

The invention is described with respect to the attached drawings, in which.

DESCRIPTION OF THE PREFERRED EMBODIMENT

Figure 1:
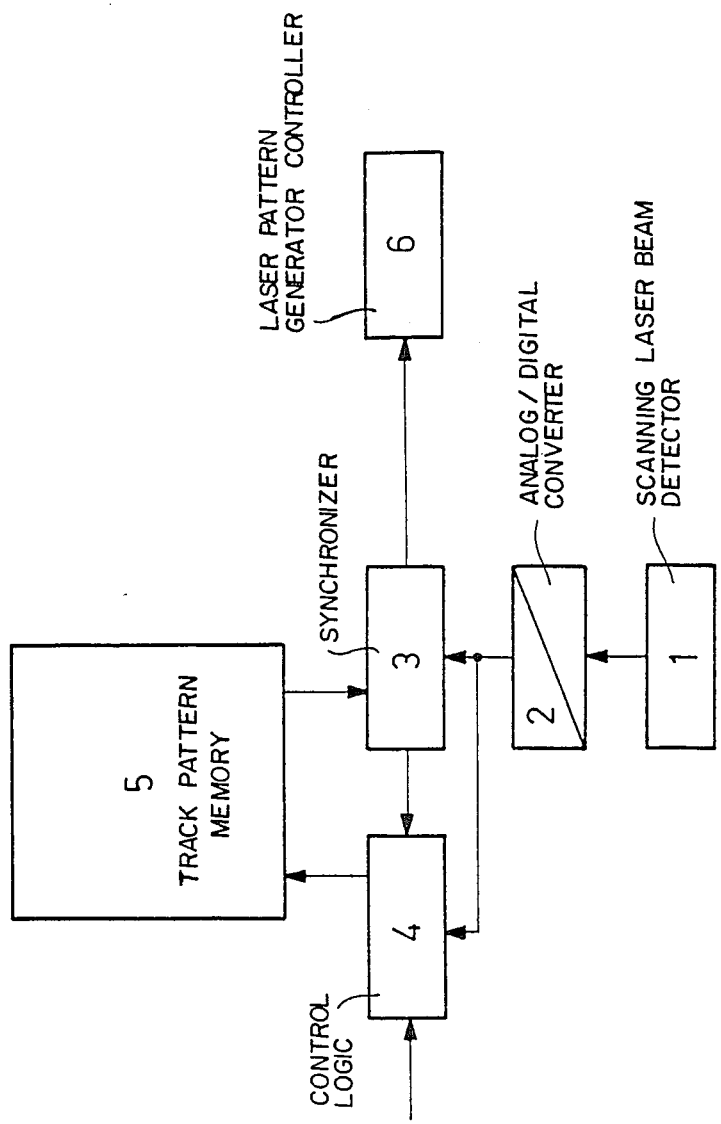
FIG. 1 represents a functional block diagram of the device in with the teachings of this invention.

Referring to FIG. 1, a scanning laser beam detector is designated by the numeral 1. An analog to digital (A/D) converter 2 is connected to a synchronizer 3 and to a control logic 4. The control logic 4 is gated to a track pattern memory 5, whereby the output of this track pattern memory 5 is connected to the synchronizer 3. The control logic 4 receives an additional signal represented in FIG. 1 as an arrow, which touches the left side of the block representing the control logic 4.

Figure 2:
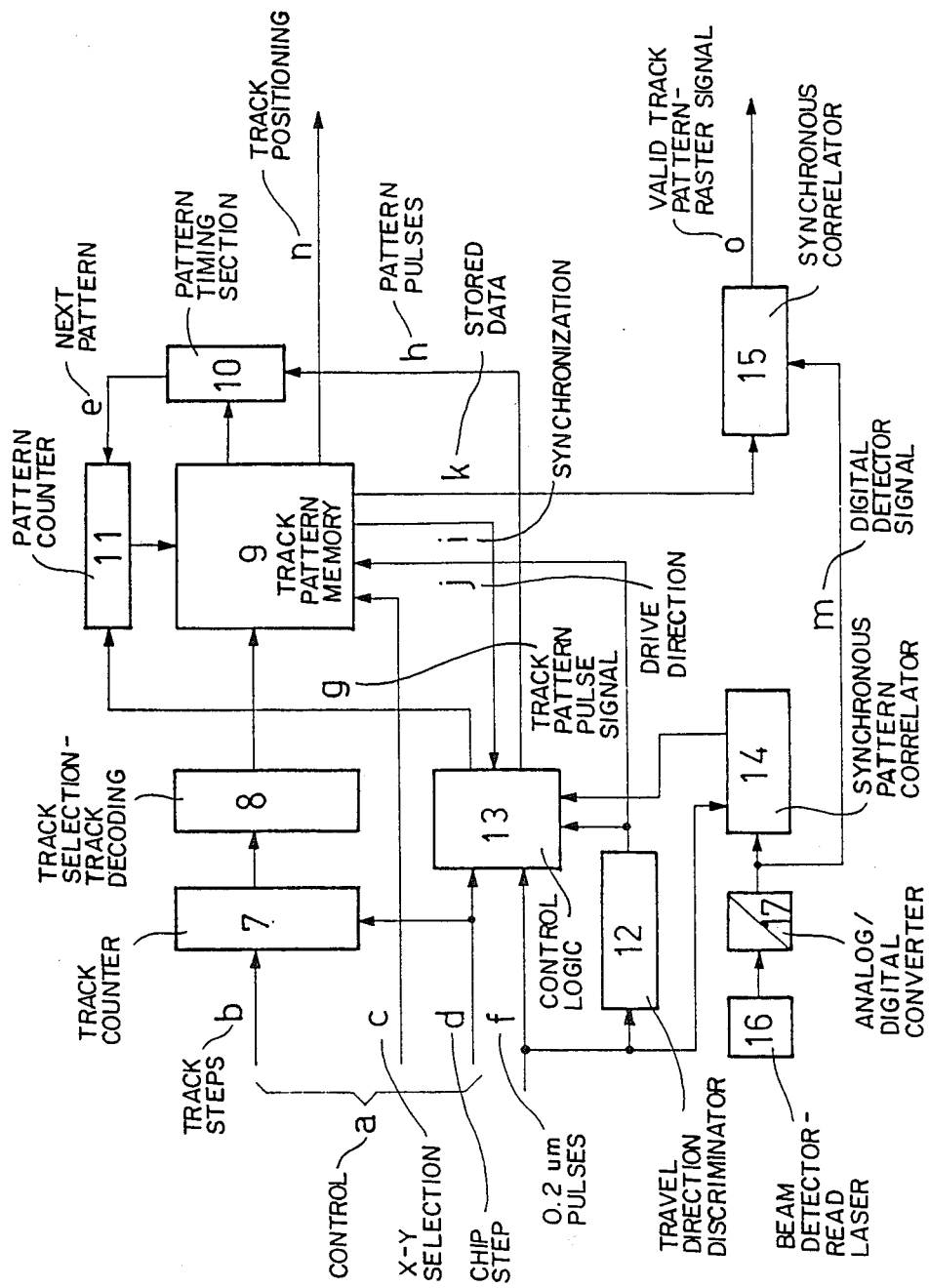
FIG. 2 shows a more detailed functional block diagram with designated connections.

Referring now to FIG. 2, inputted track pulses b are counted in a track counter 7 to provide a count indicative of a total line within a workpiece. The workpiece may be a semiconductor chip, which has, for instance, 500 lines. There are, of course, various kinds of workpieces. For this reason, when exchanging one chip for another, different pulses b are generated as are indicative of the distinct track steps of the chip. In particular, the track counter 7 receives a track pulse b for each change of track of the scanned chip. For example, one track pulse b could correspond to a mechanical step in the y-direction of 8 μm from the motor control of the x-y table carrying the chip. For instance, the track counter 7 may comprise of, for 1000 possible write tracks, a 12-bit binary counter with a clock and a reset input. This apparatus could be adapted for any possible number of tracks on a specific chip by varying the number of bits per counter step.

These counted tracks are then assigned patterns via a track selector 8 (also known as a track decoder), within the chip or the laser generator. The next functional block is a track pattern memory 9, in which all possible variations of track patterns are stored. The track selector 8 functions to select or address the valid track pattern derived from the track number as counted by the track counter 7. For instance, a chip could be made up of only four different types of tracks. The track selector 8 could preferably take the form of a memory (EPROM, ROM, RAM). This memory, especially as a RAM, can also be part of a memory of a computer, which facilitates the adaptability of the decoder to different kinds of chips.

Preferably, the memory 9 also stores all of the control signals associated with the track pattern, e.g., the synchronization or window signal i. The addressing of a particular track pattern within the memory 9 is done in response to the output of the track decoder 8, the work or drive direction signal j, as well as a signal indicative of the travel direction of the laser beam in relation to the chip from right to left or vice versa. For example, if the chip axis to be scanned is the x-axis, the work direction signal j may be a logical 0; if the chip axis to be scanned is the y-axis, the work direction signal j may be a logical 1. The track pattern memory 9 can, according to requirements, be a RAM, EPROM and, like the track decoder 8, be part of the address space of a computer. In an illustrative embodiment wherein a pattern timing section 10 is omitted, the track pattern can be stored so that each address of the memory 9 corresponds to a mechanically travelled path of 1 μm, and each bit of the n-bit wide memory word will be added to another track type or to the necessary control signals.

The addressed pattern is then read out from the pattern memory 9 and applied to a pattern timing section 10, where the necessary time expansion takes place with the help of track pulses. This means that the pattern or path information in the track pattern memory 9 can be stored in compacted form. The track pattern memory 9 furnishes the information for however many cycles of the pattern pulses h that the track information is indicative of a metal (or alternatively, a non-metal) surface. When the required path on the chip is travelled, after going through the corresponding number of pattern pulse cycles, the signal e increases by one the address of the pattern counter 11. For instance, the pattern pulse h can have a resolution of 1 μm. The pattern timing section 10 can for example be implemented with an 8-bit count down circuit with parallel load, reset input and borrow output. The section 10 is preferably only used if there are large chip structures or relatively long path structures and the chip pattern does not change rapidly. For instance with chip structures with a metal pitch of 8 μm, section 10 is preferably eliminated and signal h becomes signal e. In principle, the pattern timing section 10 can also be a component of the track pattern memory 9.

In response to the input signals e and g, the pattern counter 11 addresses the memory 9 to read out the pattern corresponding to the travelled path. Every cycle of the "next pattern" signal e selects the next address. By means of the signal g, the track pattern counter 11 can be "enabled" or "disabled" (simultaneous reset). Illustratively, a track pattern counter 11 may comprise an n-bit count-up counter with an enable and a reset. The counter 11 may have an N number of stages according to required pattern lengths. The selected track is read out into the pattern counter 11 by the track selector 8 and sent to the pattern timing section 10.

The scanning direction c (x-y selection) is fed directly into the track pattern memory 9, which subsequently outputs the corresponding information about that scan. At the beginning of each chip row, the track counter 7 starts counting upwards from zero using track steps b. The pulses f are fed into the control logic 13 at intervals of 0.2 μm. The chip step d influences the track counter 7 as well as the control logic 13. These signals b, c and d comprise a control group a.

A control logic 13 then assumes control and provides the synchronization which starts the pattern counter 11 at the new entry code and the track pattern pulse signal g in order to scan the pattern correctly. The control logic 13 upon recognition of the entry code corresponding to the reference mark on the chip by operation of a synchronous pattern correlator 14, gates the pattern pulse h to the pattern timing section 10 and applies the track pattern pulse signal g to the pattern counter 11. The output of the pattern pulses h is stopped upon detection of a travel or drive direction signal j from the discriminator 12 or a chip step d. This chip step d may be provided by a motor control for the x-y table or an override control of the control logic 12 each time it changes over to a new row of chips. This signal d also triggers a reset of the track counter 11. Furthermore, the control logic 13 receives a synchronization signal i which makes it possible to effect an alignment between the output of the track pattern memory and the "as detected" signal from the beam detector 16.

Synchronization occurs within the control logic 13 by dividing the inputted pulses f by five and that this divided pulse is transmitted as the pattern pulses h to the pattern timing section 10. If it is necessary to increase the rate at which the output is read out from the track pattern memory 9 for a short time, the division can be by four and not by five. If it is necessary to slow down the output, the division should be by six. Such division can, for example, be done by means of a binary counter with decoded output signals and a reset. The pulses f in 0.2 μm intervals are then applied to the pattern timing section 10, which outputs the next pattern e. The pattern timing is set by the pattern pulses h. The control logic 13 receives a signal j from the travel direction discriminator 12, indicative of the direction of travel of the table carrying the chip. In particular, the travel direction discriminator 12 determines the particular travel direction by means of a two-phase quadrature signal. In its simplest form this could, for example, be done with a D flip flop which, triggering on the positive edge of one phase, stores the logic level of the other phase.

The complete digitally stored information is held in a synchronized pattern correlator 14. The synchronous pattern correlator 14 detects the entry of the laser beam onto a chip with the help of the synchronization pattern or reference mark located on the edge of the chip. The synchronization pattern p comprises illustratively a set of 4 μm wide metal stripes separated from each other by a 6 μm wide silicon region. As the laser beam scans the synchronization pattern p, the laser beam detector 16 applies a corresponding signal of a waveform shown in FIG. 3 to an analog to digital (A/D) converter 17, which furnishes a binary signal t corresponding to this configuration of metal and non-metal due to the different degrees of reflection of the laser beam, i.e., a logic 1 represents metal and logic 0 represents non-metal. The track pulse steps b are shown with a spacing r.

Figures 3, 4:
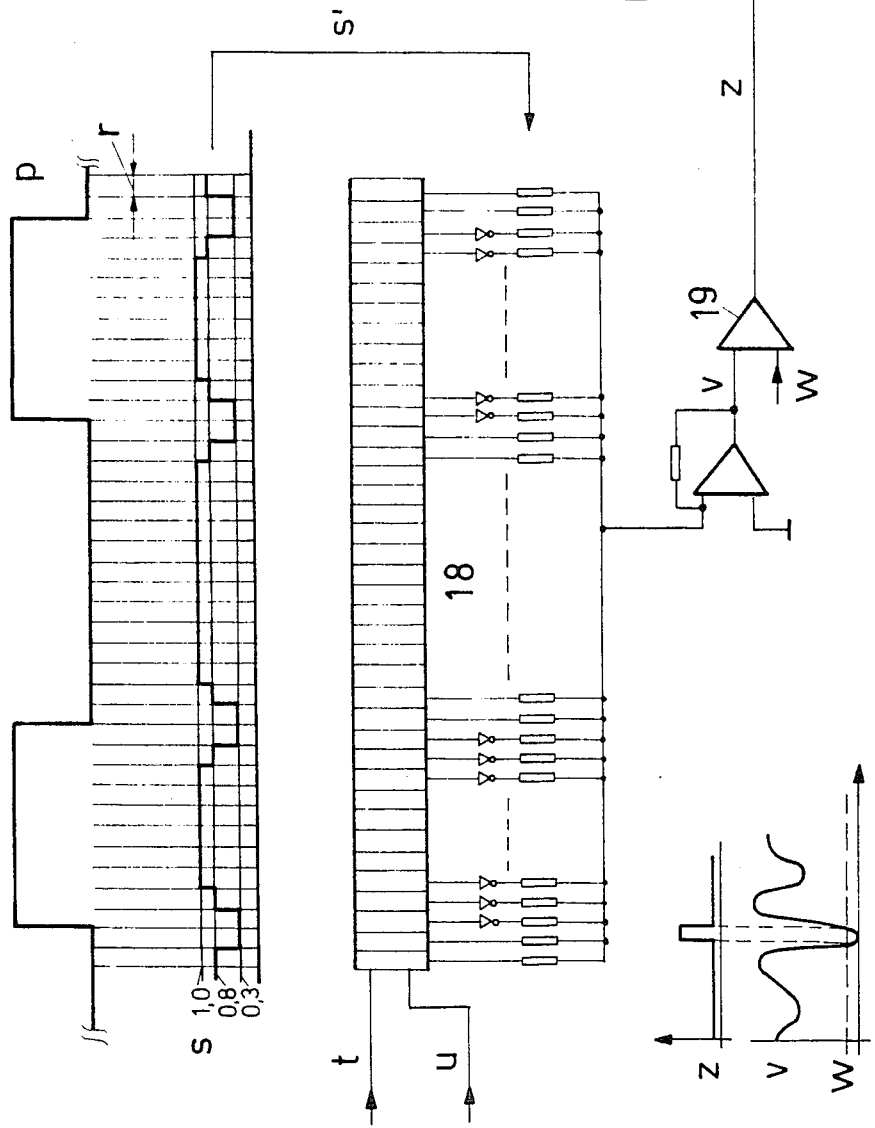
FIG. 3 shows an illustrative embodiment of a synchronization pattern correlator as may be incorporated into the of FIG. 2.
FIG. 4 shows the waveforms of the signals appearing in the correlator of FIG. 3.

The synchronization pattern correlator 14 tolerates a level of error in the placement of the stripes of the synchronization pattern p. For instance, an accuracy of 0.5 μm is tolerated. FIG. 3 shows an example of a synchronous pattern correlator 14 in the form of a 39-step shift register 18, whereby the reference number 18 designates the whole shift register. As shown in FIG. 3, the output signal of the detector 16 is derived with the help of 0.4 μm track pulses u from the measuring system and is input into the shift register 18. The change from metal to non-metal and vice versa should be weighted less than other parts of this structure due to fabrication defects of the chip structures or the conversion errors into a binary signal. Defects in these parts of the structure therefore have a lesser influence on recognition. An example of weighting is represented by s'. This weighting can be done by means of resistors, a lower weight corresponds to a higher resistance value. The left part of FIG. 3 shows the selected weightings s' with the values 0.3, 0.8 and 1.0. A digital detector signal t is simultaneously input with the track pulses u into the shift register 18. The weighting s' is shown symbolically with s' between the diagram and the shift register 18.

When the shift register 18 is read out in parallel, those portions represented by a logical 1 in the anticipated signal will be passed through an invertor. If the synchronization pattern as represented by p is input into the shift register 18, the sum of the signals becomes zero at the node. An operational amplifier is connected to the common output of the shift register 18 through which the sum v of the output signals is fed to a comparator 19, in which a comparison with a threshold set by a maximum allowable error signal w takes place. A synchronization signal z is derived in this way. FIG. 4 illustrates graphically how the comparator 19 operates. The lower part of FIG. 4 shows the sum signal v of output signals of the shift register 18 and the maximum allowable error signal w. In the upper part, the resulting synchronization signal z is represented. The output signal of the comparator 19 indicates values of summed signal v below the threshold signal w. The threshold signal w can be set as a measurement of the conformity of the read-in pattern with the expected pattern. The comparator 19 supplies the signal z according to sub-threshold values. This enables a correct start up of the stored track pattern synchronous to the actual movement of the chip entry.

Referring now to FIG. 2, a synchronous correlator 15 compares the analog signal received from the scanning laser beam detector 16 with the pattern read out from the track pattern memory 9. There are two alternatives. First, the digital pattern is output using only the timing of the analog signal to correct it when necessary. The analog signal has only a synchronizing effect in this case. On the other hand the digital signal can be overlaid on the analog signal to improve the signal to noise ratio whereby the combined signal furnishes the data for the control. The synchronous pattern correlator 14 outputs, in the case of the highest possible correlation with the reference pattern, a digital synchronization signal z to the control logic 13.

Synchronization of the stored or synthetic digital detector signal from the memory 9 with respect to the actual digitized signal M as derived from the A/D converter 17, takes place in the synchronous correlator 15. Using this technique, it can be determined if the scanning laser beam is reflected or influenced by the raster or the workpiece itself or, in other words, by the metal or non-metal surfaces. The synthetic signal predetermines a window, into which that signal from the detector 16 as indicative of a topographical feature of the chip such as a hole, must fall. A control signal o will be generated accordingly. There is no dependence upon time for the control cycle, since track pulses can either be generated by means of a measuring system or by a stepping motor which outputs a track pulse for each step. Synchronization does not occur only once during a single sweep across the entire workpiece, but rather on a chip by chip basis. Within an individual chip, after entry code recognition by the synchronous pattern correlator 14 has occurred, the pattern within the chip is output and an additional synchronization takes place with the help of the synchronous correlator 15 in order to correct warpage, expansion etc.

The synchronous correlator 15 can furthermore improve synchronization between the track pattern and the chip. If the actual position of the holes within the chip structures are to be sufficiently well detected, it is not possible by a single detection of the holes. With the help of a synchronous signal stored in the track pattern memory 9, and after multiple readings of the environment of a hole, a reduction of the statically distributed disturbances is achieved. For instance, these disturbances can be input into several shift registers sequentially and by comparison of their contents, determine the actual hole position. The size of the shift registers is determined by the number of scans and the length of a scan. Preferably, this corrected signal can be returned to the control logic 13 to enable synchronization. Either the corrected signal m or the synchronously stored pattern k can be transmitted as the signal o to control the laser pattern generator.

According to the invented process, a distance measuring system supplies the necessary pulses which serve as the units of measure for the scanned track. The x-y positions of the workpiece with respect to the location of the entrance structure or reference mark at the chip edge, are used to gate out the pattern from the track pattern memory 9 at the correct rate. The advantages of the present invention are to be seen in the fact that small defects on the scanned surface or apparent voids which could lead to errors, will be ignored. With a reference pattern distance of 8 to 13 μm illustratively, intermediate distances can be very precisely determined, with under one micrometer accuracy. Thus the geometries on the surface can be decreased, e.g. the width of the spacings can be reduced to 2 μm. This also makes it possible for synchronization to take place over wider intervals.

We claim:

1. A method of controlling with improved accuracy the related movement between a laser beam and a workpiece bearing a coded pattern, said method comprising the steps of:
   (a) scanning the laser beam across the workpiece and its coded pattern;

(b) detecting the scanning laser beam reflected from the coded pattern and providing a pattern signal indicative thereof;
(c) storing a track pattern in a memory corresponding to a true coded pattern;
(d) applying the pattern signal to the memory to read out the true code pattern; and
(e) comparing the read out code pattern with the pattern signal and, if valid, using the validated pattern signal to control the relative movement between the work piece and the scanning laser beam.

2. The method as claimed in claim 1, wherein the pattern signal is converted into digital form.

3. The method as claimed in claim 1, wherein there is further included the steps of developing track pulses, gating the pattern signal in response to the track pulses into a shift register having a plurality of stages, weighting each stage according to its information value, deriving weighted output signals from each of the plurality of stages, summing the weighted output signals to provide a corresponding summed signal and comparing the summed signal with an allowable maximum error tolerance signal and, if exceeded, providing a synchronization signal.

4. Apparatus for controlling the movement of a workpiece bearing coded pattern, said apparatus comprising:
(a) means for repetitively scanning a read laser beam across the workpiece and its coded pattern;
(b) means for moving the workpiece with respect to said laser beam scanning means;
(c) means for detecting said laser beam reflected from the coded pattern and providing a pattern signal indicative thereof;
(d) memory means for storing a true coded pattern;
(e) generator means for generating a writing laser beam onto the workpiece in a desired pattern;
(f) control logic means for apply a trigger signal to said memory means to read out the true coded pattern; and
(g) synchronizer means coupled to said detecting means and to said memory means, and comprising means for receiving and comparing said pattern signal and said true code pattern and, if valid, for using the validated pattern signal to control the relative movement between the workpiece and said read laser beam, and means for providing correction signals to said control logic means and a control signal to said laser generator means.

* * * * *